United States Patent [19]

Bonkohara

[11] 4,080,485
[45] Mar. 21, 1978

[54] FINE GOLD WIRE FOR USE IN CONNECTION IN A SEMICONDUCTOR DEVICE

[75] Inventor: Manabu Bonkohara, Tokyo, Japan

[73] Assignee: Nippon Electric Co., Ltd., Tokyo, Japan

[21] Appl. No.: 755,012

[22] Filed: Dec. 28, 1976

[30] Foreign Application Priority Data

Dec. 29, 1975 Japan .................................. 51-158767

[51] Int. Cl.² .................................................. C22C 5/00
[52] U.S. Cl. ........................................ 428/620; 75/165; 357/67
[58] Field of Search ............................ 75/165; 357/67; 428/620

[56] References Cited

PUBLICATIONS

Wise, E. M., *Gold,* Van Nostrand Co., 1964, pp. 345–354.
Davis, G. L., Gold Bulletin, vol. 7, No. 4, 1974, p. 92.

*Primary Examiner*—M. J. Andrews
*Attorney, Agent, or Firm*—Hopgood, Calimafde, Kalil, Blaustein and Lieberman

[57] ABSTRACT

A fine wire made of a gold alloy for use in a semiconductor device. The alloy consists essentially of at least one control element selected from the group consisting of carbon in an amount of 1 to 25 wt. ppm., silicon in an amount of 1 to 25 wt. ppm., germanium in an amount of 3 to 30 wt. ppm., tin in an amount of 5 to 30 wt. ppm., and lead in an amount of 5 to 30 wt. ppm.; with balance gold of a purity of more than 99.995 wt.

10 Claims, 3 Drawing Figures

FINE GOLD WIRE FOR USE IN CONNECTION IN A SEMICONDUCTOR DEVICE

This invention relates to a fine gold wire for use in direct connection from one electrode on a semiconductor chip to one lead in a lead frame or the like.

STATE OF THE ART

A semiconductor chip having transistor or integrated circuit thereon is formed with a plurality of electrodes, i.e., bonding pads to be electrically connected to an external circuit. Hitherto, a semiconductor device has been manufactured according to a process of: punching a thin metal sheet into a lead frame consisting integrally of a plurality of leads and a chip mounting portion; mounting a semiconductor chip on the chip mounting portion of the lead frame, and brazing the former to the latter; connecting the inner tips of a plurality of leads of the lead frame to the bonding pads on the semiconductor chip by using a fine gold wire of a diameter of 10 to 100 $\mu$ (preferably from 25 to 30 $\mu$); and sealing the semiconductor chip and tips of the leads with resin.

A conventional fine gold wire as used in a semiconductor device, which has been available in the market, contains impurities of 150 to 200 wt ppm. A thermocompression bonding process is used for connecting the end of a fine gold wire to the bonding pad or the tip of lead by melting the end of fine gold wire by hydrogen flame to produce a ball-shaped molten portion and then forcing the molten portion on to a bonding pad or the tip of lead. In this thermo-compression bonding process, the molten portion of the bonded wire is upset into a shape like a head of a nail, and hence referred to as "nailhead thermocompression bonding" (this will be referred to as NTC bonding hereinafter).

However, such a bonding process using the conventional gold wire suffers from disadvantages in that when one end of the fine gold wire is molten by a hydrogen flame, there are produced oxides of impurities on the surface of a molten portion, thereby impairing its bonding strength, when bonded on a bonding pad or the lead, and that the shapes of molten portions are not uniform due to lower surface tensions of molten gold based on large amounts of impurities, so that molten portions are spread beyond the edges of bonding pads when bonded thereon, thereby presenting a danger of causing shortcircuiting with the other portion on a chip. These disadvantages may be avoided by using a gold wire of an increased purity. However, an increased purity of a gold wire leads to the lowering in mechanical strength of the gold wire. As a result, when a gold ingot is drawn into a fine gold wire in a wiredrawing process, the wire leads to be broken in the course of drawing or entangled with or clung to each other, presenting a considerable difficulty in handling of wires. In addition, when a bonding tool is shifted during the bonding process, a fine gold wire is liable to be broken or to droop down to contact with a semiconductor chip, causing shortcircuiting therewith.

OBJECT OF THE INVENTION

It is an object of the present invention to provide a fine gold wire for use in a semiconductor device, which wire is high in mechanical strength and provides a positive and strong bond between the gold wire and a bonding pad on a semiconductor chip, a lead tip of a lead frame, or the like bonding portion.

THE INVENTION

According to the present invention, there is provided a fine wire made of an alloy consisting assentially of at least one control element selected from a group consisting of from 1 to 25 weight ppm carbon (C), from 1 to 25 weight ppm silicon (Si), from 3 to 30 weight ppm germanium (Ge), from 5 to 30 weight ppm tin (Sn) and from 5 to 30 weight ppm lead (Pb), and the balance high-purity gold. The purity of gold to be used in the alloy should be 99.995 wt.% or more and normally less than 99.999 wt.%. In other words, the gold material to be used in the alloy contains element gold in an amount of 99.995 wt.% or more and an impurity element or element other than the elements of the group (C, Si, Ge, Sn and Pb). Therefore, it may be said that the alloy of the fine wire of the invention consists essentially of at least one of the control elements of C in an amount of 1 to 25 wt. ppm, Si of 1 to 25 wt. ppm, Ge of 3 to 30 wt. ppm, Sn of 5 to 30 wt. ppm and Pb of 5 to 30 wt. ppm, an impurity element or elements other than the mentioned control elements in an amount of less than about 50 wt. ppm, and the balance element Au. Where a plurality of the mentioned elements are contained, the total amount of the mentioned elements in the alloy should be not more than 100 wt. ppm.

A fine gold wire including C, Si, Ge, Sn, or Pb in the specified amount provides an optimum mechanical strength and allows easy drawing of an alloy gold into a fine wire, while a fine gold wire will not cling to or become entangled with each other, presenting ease of handling. In addition, even in the course of bonding, a fine gold wire will not be broken, nor droop after bonding.

Still furthermore, when the tip of a fine gold wire is molten, there is little or no oxide formed on the surface of a molten portion, so that the strength of a bond is increased and there may be achieved a uniform spherical shape and size of molten portions of gold wires, thus avoiding a danger of the tip of a gold wire spreading beyond the edge of a bonding pad when bonded thereon.

These and other objects and features of the invention will become more apparent from the following description taken in conjunction with the accompanying drawings, wherein.

Figure 1:
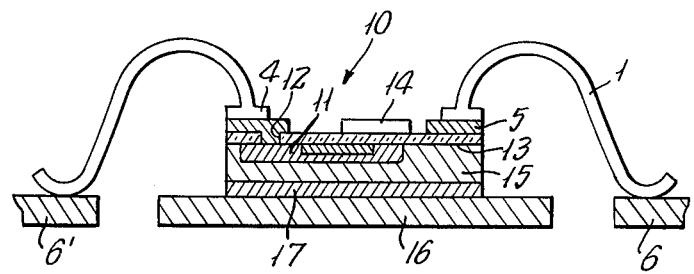
FIG. 1 is a partial cross-sectional view illustrative of one process for manufacturing a semiconductor device.
Figure 2:
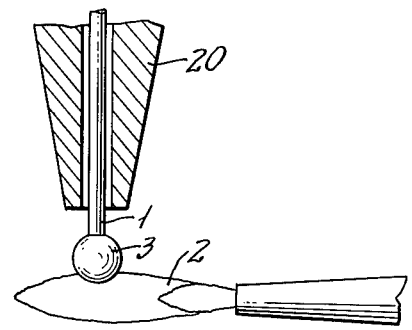
FIG. 2 is a partial cross-sectional view illustrative of a process for melting the tip of a fine gold wire by a hydrogen flame.

Description will now be given of a semiconductor device with reference to FIGS. 1 and 2. A semiconductor chip 10 includes a silicon substrate 15. A plurality of electric elements 11 such as transistors are formed in the surface of the silicon substrate 15 according to the well-known impurity diffusion process. Openings 12 are provided in a silicon oxide film 13 formed on a surface of the substrate 15 for electric connections. A desired wiring 14, and bonding pads 4 and 5 are formed on the silicon oxide film 13 by vacuum-evaporating aluminum over the entire surface of the silicon oxide film 13 and the exposed surface of the substrate 15 and then subjecting to photo-etching process. The semiconductor chip 10 thus formed is brazed by using a brazing material 17 to a chip-mounting portion 16 of a lead frame consisting integrally of a plurality of leads 6,6' and a chip-mounting portion 16, which have been punched out from a metal sheet. The interconnections between the bonding pads 4 and 5 and the leads 6, 6' are achieved by use of fine gold wires 1 bonded by the NTC bonding process.

Meanwhile, such interconnections are formed as follows. A fine gold wire 1 having a diameter of 25 to 30 μ is wound on a spool (not shown) which is placed in a bonding apparatus. The fine gold wire 1 is led from the spool into a central hole in a bonding tool 20. The tip of a fine gold wire 1, which protrudes from the central hole in the bonding tool 20, is molten by a hydrogen flame 2 to form a spherical molten portion 3 at the tip of the fine gold wire 1. Then, the bonding tool 20 is brought onto the bonding pad 4 or 5 on the semiconductor chip 10 in a manner to force the molten portion 3 of the wire 1 on to the bonding pad 4 or 5 for bonding the lead wire 1 to the bonding pad 4 or 5.

Subsequently, the bonding tool 20 is lifted and shifted onto the tip of a lead 6' or 6, while drawing out or unwinding a fine gold wire 1 from the spool, thereby forcing the tip of the tool 20 onto the tip of a lead 6' or 6 to thermally bond the fine gold wire 1 to the lead 6' or 6. At this time, the tip of the lead 6' or 6 is preheated to a suitable temperature for bonding a fine gold wire, so that simple pressing of the fine gold wire 1 against the lead 6' or 6 results in easy bonding. The bonding tool 20 is then lifted, with the fine gold wire 1 locked therein, so that the fine gold wire 1 is cut off. The aforesaid bonding process is likewise applied to another bond between another bonding pad, and another lead. Thereafter, the chip 10 is sealed with resin, and then the lead frame is punched out into individual devices.

A conventional fine gold wire employable for the aforesaid device contains impurities of 150 to 200 wt. ppm. The impurities contained in the conventional fine gold wire provide varying composition, as shown in Table 1.

Table 1

| Major impurities | Sample | | |
| --- | --- | --- | --- |
| | A | B | C |
| Al | 7 (wt.ppm) | 9 (wt.ppm) | 4 (wt.ppm) |
| Fe | 10 | 9 | 6 |
| Si | 21 | 15 | 11 |
| Sn | <1 | <1 | <1 |
| Mg | 5 | 7 | 4 |
| Pb | 30 | 54 | 28 |
| Mn | <1 | <1 | <1 |
| Cu | 52 | 46 | 39 |
| Ag | 70 | 56 | 61 |

Fine gold wires having compositions as above provide considerably high mechanical strength and ease of manufacture thereof in addition to ease of handling, while suffering from disadvantages in that, when the tip of a fine gold wire is molten, a great amount of oxides of impurities are produced on the surface of a molten portion, thereby adversely affecting its bonding strength.

Figure 3:
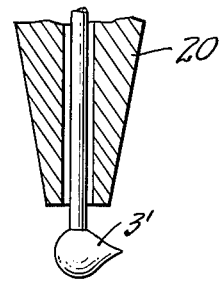
FIG. 3 is a view showing a condition of the tip of a conventional fine gold wire which has been molten by using a hydrogen flame.

In addition, the shape of a molten portion at the tip of a fine gold wire does not assume a spherical form but extends partially outwardly, thereby providing a molten tip portion 3' as shown in FIG. 3. The aforesaid irregular shape of the molten portion 3 may be attributed to a reduced surface tension of a molten portion, due to a lead content exceeding 50 wt. ppm, a copper content exceeding 40 wt. ppm, a silicon content exceeding 30 wt. ppm or the total of these elements exceeding 100 wt. ppm.

For overcoming these shortcomings, there has been proposed an attempt to provide fine gold wires of a diameter of 30 μ and purities of 99.995 wt.% and 99.999 wt.% by electrolytically refining the gold ingot which has been used for a fine gold wire. However, a fine gold wire thus prepared was found to be low in mechanical strength and tend to be broken in the course of drawing an alloy gold into a wire. In addition, the fine gold wire is liable to cling to or become entangled with each other during the wire drawing process, presenting a difficulty in handling. Furthermore, a fine gold wire thus prepared is often broken even during the bonding process or tends to droop after bonding, thereby causing disconnection or shortcircuiting with a semiconductor chip. This is because gold of purities of 99.995 and 99.999 wt.% contains a very small amount (50 to 10 wt. ppm.) of impurities, so that the gold wire exhibits the properties of a pure gold itself, presenting low mechanical strength and high softness.

A molten portion obtained when the tip of a fine gold wire made of high-purity gold is molten assumes a spherical form, with little oxidized material of the impurities appearing on the surface thereof.

Table 2

| Main impurities | Sample D (gold wire of a purity of 99.999 wt.%) | Sample E (gold wire of a purity of 99.995 wt.%) |
| --- | --- | --- |
| Al | <1 (wt.ppm) | 1 (wt.ppm) |
| Fe | 1 | 4 |
| Si | <1 | <1 |
| Sn | <1 | <1 |
| Mg | <1 | <1 |
| Pb | <1 | 2 |
| Mn | <1 | <1 |
| Cu | 4 | 18 |
| Ag | 4 | 19 |

Examples of the present invention will be described in detail with reference to Table 3. Samples A to E in Tables 2 and 3 were used as a base metal of gold in Table 3. Purities of gold used in respective samples are 99.995 to 99.999 wt.%. Therefore, the gold material contains 50 to 10 wt. ppm of the uncontrolled impurity. According to the examples of the invention, one control element selected from a group consisting of carbon (C), silicon (Si), germanium (Ge), tin (Sn) and lead (Pb) was added as a controlled impurity to the high-purity gold thus prepared. A gold alloy containing a relatively large amount, say, 1 wt.% of the mentioned controlled impurity was prepared, and then a given amount of the gold alloy was put in a highly purified gold which had been molten by a high frequency induction heating, so as to provide a gold alloy thus prepared was drawn into a wire of a diameter of 20 to 30 μ.

Table 3

| | base metal | impurity element (wt.ppm) | | properties of wire of a diameter of 30 μ | | | |
|---|---|---|---|---|---|---|---|
| | | | | tensile strength | elongation | shape of molten portion and the like | others |
| conventional fine gold wire | A | Ag,Cu,Si,Pb etc. (total 195) | | 13(g) | 9(%) | irregular shape, and much oxides | less bonding strength, and broken frequently |
| | B | Ag,Cu,Si,Pb etc. (" 197) | | 13 | 10 | | |
| | C | Ag,Cu,Si,Pb etc. (" 153) | | 13 | 8 | | |
| | D | Ag,Cu,Fe etc. (" 9) | | 9 | 6 | spherical shape | droop after bonding |
| | E | Ag,Cu,Fe etc. (" 44) | | 10 | 6 | " | |
| example (1) | D | C(1) | in addition to impurity D | 10 | 6 | spherical shape | droop to some extent but acceptable |
| (2) | D | Si(1) | " | 11 | 6 | " | good bonding characteristic |
| (3) | D | Ge(3) | " | 11 | 6 | " | " |
| (4) | D | Sn(5) | " | 11 | 6 | " | " |
| (5) | D | Pb(5) | " | 11 | 6 | " | " |
| (6) | E | C(25) | in addition to impurity E | 14 | 7 | " | " |
| (7) | E | Si(25) | " | 14 | 7 | " | " |
| (8) | E | Ge(30) | " | 15 | 7 | " | " |
| (9) | E | Sn(30) | " | 15 | 8 | " | " |
| (10) | E | Pb(30) | " | 15 | 8 | " | " |
| (11) | E | C(50) | " | 15 | 7 | | |
| (12) | E | Si(50) | " | 15 | 8 | irregular shape and much oxides on surface | less bonding strength |
| (13) | E | Ge(50) | " | 15 | 7 | | |
| (14) | E | Sn(50) | " | 14 | 7 | | |
| (15) | E | Pb(50) | " | 14 | 7 | | |

Note: quantities of impurity element described in the examples (1) - (15) are shown by that to the total composition of the obrained wire.

As is clear from Table 3, a high mechanical strength of a gold wire and a spherical molten portion free of oxides on its surface may be achieved by an alloy containing one of the control elements of from 1 to 25 wt. ppm carbon (C), from 1 to 25 wt. ppm silicon (Si), from 3 to 30 wt. ppm germanium (Ge), from 5 to 30 wt. ppm tin (Sn), and from 5 to 30 wt. ppm lead, 50 wt. ppm or less impurity other than the mentioned control elements, and the balance element gold (Au). In addition to the examples containing only one element as the controlled impurity, a plurailty of controlled impurities selected from the mentioned elements may be contained in the alloy, while the total content of the controlled impurities should be less than 100 wt. ppm. In case the content of control impurities exceeds 100 wt. ppm, then there results in an irregular shape of a molten portion or appearance of oxides of impurities on the surface of the molten portion.

As has been described earlier, if the purity of gold is too high, then there results in lowering in mechanical strength. In contrast thereto, the gold wire according to the present invention has an increased mechanical strength due to existence of the controlled impurity or impurities of a given content. Accordingly, fine gold wires may be manufactured with ease by drawing. In addition, fine gold wires according to the present invention were found free of breakage due to shifting of a bonding tool during the bonding process. In addition, fine gold wires according to the invention are free of drooping after bonding, thereby avoiding shortcircuiting with a semiconductor chip.

Yet furthermore, since the total amount of impurities contained in a gold wire is less, the amount of oxides to be produced on the surface of a molten portion is minimized. As shown in Examples 11 to 15, when carbon and silicon contents exceed 25 wt. ppm, respectively, or when germanium, tin and lead contents exceed 30 wt. ppm, respectively, considerable amount of oxides are produced on the surface of a molten portion and irregular shape of molten portions result. The same result was obtained in case the total content of the controlled impurities exceeds 100 wt. ppm.

As is apparent from the foregoing description, a desired mechnical strength and bonding characteristics and free of unwanted droop may be achieved in a fine gold wire according to the present invention, which contains, by wt ppm, at least one control element selected from a group consisting of from 1 to 25 ppm carabon (C), and silicon (Si), from 3 to 30 ppm germanium (Ge), and from 5 to 30 ppm tin (Sn) and lead (Pb), with the total content of impurities limited up to 100 wt. ppm, and the balance high-purity gold of a purity of 99.995 wt.% or more.

The diameter of wire should range from 10 to 100 μ, preferably from 10 to 30 μ, for achieving the mechanical strength suited for bonding for connection in a semiconductor device. In case the diameter of a fine gold wire is excessively large, there results excessively high mechanical strength and an increased amount of a molten portion, when the tip of a fine gold wire is molten, so that the molten portion is spread beyond the edge of a bonding pad when bonded thereon. On the other hand, a fine gold wire of excessively small diameter is unsatifactory in mechanical strength for use in connection in semiconductor device, resulting in breaking frequently during bonding process.

What is claimed is:

1. A fine wire for use in a semiconductor device, made of a gold alloy consisting essentially of carbon in an amount of 1 to 25 wt. ppm. with the balance gold of a purity of more than 99.995 wt. percent.

2. A fine wire for use in a semiconductor device, made of a gold alloy consisting essentially of silicon in an amount of 1 to 25 wt. ppm. with the balance gold of a purity of more than 99.995 wt. percent.

3. A fine wire for use in a semiconductor device, made of a gold alloy consisting essentially of germanium in an amount of 3 to 30 wt. ppm. with the balance gold of a purity of more than 99.995 wt. percent.

4. A fine wire for use in a semiconductor device, made of a gold alloy consisting essentially of tin in an amount of 5 to 30 wt. ppm. with the balance gold of a purity of more than 99.995 wt. percent.

5. A fine wire made of a gold alloy consisting essentially of at least one control element selected from the group consisting of carbon in an amount of 1 to 25 wt. ppm., silicon in an amount of 1 to 25 wt. ppm., germanium in an amount of 3 to 30 wt. ppm., tin in an amount of 5 to 30 wt. ppm., and lead in an amount of 5 to 30 wt. ppm., the total amount of said control elements not exceeding 100 wt. ppm, with the balance gold of a purity of more than 99.995 wt. percent.

6. A fine wire as set forth in claim 5, wherein said fine wire is of a diameter ranging from 10 to 100μ.

7. A fine wire for use in a semiconductor device, made of a gold alloy consisting essentially of at least one control element selected from the group consisting of carbon in an amount of 1 to 25 wt. ppm., silicon in an amount of 1 to 25 wt. ppm., germanium in an amount of 3 to 30 wt. ppm., tin in an amount of 5 to 30 wt. ppm., and lead in an amount of 5 to 30 wt. ppm.; the total amount of said control elements not exceeding 100 wt. ppm, and the balance gold of purity of more than 99.995 wt. percent.

8. A fine wire as set forth in claim 7, wherein said fine wire is of a diameter ranging from 10 to 100μ.

9. In a semiconductor device employing a fine gold wire as an electrical connector, the improvement wherein the composition of said wire consists essentially of at least one control element selected from the group consisting of carbon in an amount of 1 to 25 wt. ppm., silicon in an amount of 1 to 25 wt. ppm., germanium in an amount of 3 to 30 wt. ppm., tin in an amount of 5 to 30 wt. ppm., and lead in an amount of 5 to 30 wt. ppm., the total amount of said control element not exceeding 100 wt. ppm., with the balance gold of a purity of more than 99.995 wt. percent.

10. In a semiconductor device employing a fine gold wire as an electrical connector, the improvement wherein the composition of said wire consists essentially of at least one control element selected from the group consisting of carbon in an amount of 1 to 25 wt. ppm., silicon in an amount of 1 to 25 wt. ppm., germanium in an amount of 3 to 30 wt. ppm., tin in an amount of 5 to 30 wt. ppm., and lead in an amount of 5 to 30 wt. ppm.; the total amount of said control elements not exceeding 100 wt. ppm, with the balance gold of a purity of more than 99.995 wt. percent.

* * * * *